United States Patent
Tanimoto et al.

(10) Patent No.: US 9,824,887 B2
(45) Date of Patent: Nov. 21, 2017

(54) NITRIDE SEMICONDUCTOR DEVICE

(71) Applicant: SHARP KABUSHIKI KAISHA, Sakai, Osaka (JP)

(72) Inventors: Yoshimi Tanimoto, Sakai (JP); Koichiro Fujita, Sakai (JP); Yushi Inoue, Sakai (JP); Takao Kinoshita, Sakai (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 15/513,492

(22) PCT Filed: Aug. 27, 2015

(86) PCT No.: PCT/JP2015/074230
§ 371 (c)(1),
(2) Date: Mar. 22, 2017

(87) PCT Pub. No.: WO2016/059889
PCT Pub. Date: Apr. 21, 2016

(65) Prior Publication Data
US 2017/0301535 A1    Oct. 19, 2017

(30) Foreign Application Priority Data
Oct. 14, 2014   (JP) ................................ 2014-210071

(51) Int. Cl.
*H01L 21/02*  (2006.01)
*H01L 23/29*  (2006.01)
(Continued)

(52) U.S. Cl.
CPC .... *H01L 21/0254* (2013.01); *H01L 21/02458* (2013.01); *C01B 21/068* (2013.01)

(58) Field of Classification Search
CPC ............. H01L 23/0217; H01L 23/0254; H01L 23/02458; H01L 23/291; H01L 23/3171; H01L 29/518
See application file for complete search history.

(56) References Cited

U.S. PATENT DOCUMENTS 6,838,397 B2 * 1/2005 Takayama ............... B32B 17/04
257/E21.269
8,587,092 B2 * 11/2013 Makiyama ............ C23C 16/345
257/183
(Continued)

FOREIGN PATENT DOCUMENTS

JP      2008-205392 A    9/2008
JP      2009-10107 A     1/2009
(Continued)

*Primary Examiner* — David Zarneke
(74) *Attorney, Agent, or Firm* — Birch, Stewart, Kolasch & Birch, LLP

(57) ABSTRACT

A nitride semiconductor device includes a substrate; a nitride semiconductor multilayer structure which is formed on the substrate, includes a first nitride semiconductor layer and a second nitride semiconductor layer having a different composition from that of the first nitride semiconductor layer, and generates two dimensional electron gas on a hetero interface between the first nitride semiconductor layer and the second nitride semiconductor layer; and an insulating film which covers at least a portion of a surface of the nitride semiconductor multilayer structure, has a concentration of Si—H bonds equal to or less than $6.0 \times 10^{21}$ cm$^{-3}$, and is formed of silicon nitride.

5 Claims, 8 Drawing Sheets

(51) Int. Cl.
  *H01L 23/31*    (2006.01)
  *C01B 21/068*   (2006.01)

(56)         References Cited

U.S. PATENT DOCUMENTS

| | | | |
|---|---|---|---|
| 8,951,853 B1* | 2/2015 | Park | H01L 21/82380 |
| | | | 438/199 |
| 9,306,027 B2* | 4/2016 | Inoue | H01L 29/4236 |
| 9,536,908 B2* | 1/2017 | Chung | H01L 27/124 |
| 9,660,045 B2* | 5/2017 | Inoue | H01L 29/518 |
| 9,696,927 B2* | 7/2017 | Cain, III | G06F 3/0622 |
| 2007/0001174 A1 | 1/2007 | Ring et al. | |
| 2008/0203541 A1 | 8/2008 | Makiyama | |
| 2009/0001381 A1* | 1/2009 | Marui | H01L 29/0653 |
| | | | 257/76 |
| 2009/0166815 A1 | 7/2009 | Makiyama et al. | |
| 2012/0028423 A1 | 2/2012 | Araya et al. | |

FOREIGN PATENT DOCUMENTS

| | | |
|---|---|---|
| JP | 2009-55042 A | 3/2009 |
| JP | 2009-164300 A | 7/2009 |
| JP | 2012-33688 A | 2/2012 |

* cited by examiner

NITRIDE SEMICONDUCTOR DEVICE

TECHNICAL FIELD

The invention relates to a nitride semiconductor device.

BACKGROUND ART

In the related art, it is known that a phenomenon called a current collapse occurs in which on-resistance changes when a voltage is applied to a field effect transistor using two-dimensional electron gas (2 DEG) generated on a hetero interface of a nitride semiconductor multilayer structure formed of a plurality of layers having different compositions; however, the current collapse may be suppressed by laminating a silicon nitride (SiN) film on the surface of the nitride semiconductor. In this regard, an effect of suppressing the current collapse is affected by the properties of the SiN film, and thus various research and development have been conducted.

The SiN film with a high effect of suppressing the current collapse has a defect in that current leaks. Accordingly, an idea has been proposed that the SiN film laminated on the surface of the nitride semiconductor has a two-layer structure including a layer which contains a large amount of hydrogen and has a function of suppressing the current collapse, and a layer which contains less hydrogen and has a function of suppressing the leakage current.

Examples of the nitride semiconductor device in which the SiN film having such a two-layer structure is laminated on the surface of the nitride semiconductor include a semiconductor device which is disclosed in Japanese Unexamined Patent Application Publication No. 2008-205392 (PTL 1). In the semiconductor device disclosed in PTL 1, a non-stoichiometry first SiN film having a high concentration of Si—H or N—H and a substantially stoichiometry second SiN film which has a small quantity of Si—H or N—H bonds and is excellent in the insulation properties are laminated on a surface of a compound semiconductor region including a GaN electron transit layer, an AlGaN electron supply layer, and a GaN surface layer, thereby intending to suppress both of the current collapse and the leakage current.

In addition, examples of the aforementioned nitride semiconductor device also include a semiconductor device which is disclosed in Japanese Unexamined Patent Application Publication No. 2009-164300 (PTL 2). In the semiconductor device disclosed in PTL 2, a stoichiometry first SiN film which has a low total concentration of the added concentration of Si—H bonds and concentration of N—H bonds and is excellent in the insulation properties, and a non-stoichiometry second SiN film which has a high total concentration of the added concentration of Si—H bonds and concentration of N—H bonds and is excellent in stabilizing a surface of the compound semiconductor are laminated on the surface of a compound semiconductor multi-layer structure including a GaN electron transit layer, an AlGaN electron supply layer, and a GaN surface layer, thereby intending to suppress both of the current collapse and the leakage current.

However, the semiconductor devices in the related art disclosed in PTL 1 and PTL 2 have the following problem.

That is, it is confirmed that even if two layers of the SiN films are laminated on the surface of the compound semiconductor region including the above-described nitride semiconductor, when a high temperature and high voltage stress test is conducted, the semiconductor device has the leakage current increased and is not able to be used as a switching device for a long period time.

CITATION LIST

Patent Literature

PTL 1: Japanese Unexamined Patent Application Publication No. 2008-205392
PTL 2: Japanese Unexamined Patent Application Publication No. 2009-164300

SUMMARY OF INVENTION

Technical Problem

In this regard, an object of the invention is to provide a nitride semiconductor device in which the properties of a SiN film laminated on a nitride semiconductor layer are improved and which is capable of being used as a switching device for a long period time with a high yield on a high temperature and high voltage stress test.

Solution to Problem

In order to achieve the above-described object, a nitride semiconductor device of the invention includes a substrate; a nitride semiconductor multilayer structure which is formed on the substrate, includes a first nitride semiconductor layer, and a second nitride semiconductor layer having a composition different from a composition of the first nitride semiconductor layer, and generates two dimensional electron gas on a hetero interface between the first nitride semiconductor layer and the second nitride semiconductor layer; and an insulating film which covers at least a portion of a surface of the nitride semiconductor multilayer structure, has a concentration of Si—H bonds equal to or less than $6.0 \times 10^{21}$ $cm^{-3}$, and is formed of silicon nitride.

In addition, in the nitride semiconductor device of an embodiment, the silicon nitride forming the insulating film has a concentration of bonds equal to or greater than $1.0 \times 10^{21}$ $cm^{-3}$.

In addition, in the nitride semiconductor device of an embodiment, the insulating film is a first insulating film and the nitride semiconductor device further includes a second insulating film which is laminated on the first insulating film, and is formed of silicon nitride of which a concentration of Si—H bonds is greater than the concentration of Si—H bonds in the first insulating film.

In addition, in the nitride semiconductor device of an embodiment, a total film thickness of the first insulating film and the second insulating film is equal to or greater than 25 nm.

In addition, the nitride semiconductor device of an embodiment further includes a third insulating film which covers at least a portion of the second insulating film, is formed of silicon nitride of which a concentration of Si—H bonds is less than the concentration of Si—H bonds in the second insulating film.

A method of manufacturing a nitride semiconductor device of the invention is a method of manufacturing the nitride semiconductor device of the invention or an embodiment, in which the insulating film is annealed at 800° C. or higher.

Advantageous Effects of Invention

As described above, in the nitride semiconductor device of the invention, an insulating film which covers at least a portion of a surface of the nitride semiconductor multilayer structure and is formed of silicon nitride has a concentration of Si—H bonds equal to or less than $6.0 \times 10^{21}$ cm$^{-3}$. Accordingly, in a case of conducting a high temperature and high voltage stress test on a semiconductor element using the nitride semiconductor device, it is possible to prevent occurrence of defects in which the leakage current after the test exceeds five times the leakage current before the test, and thereby it is possible to improve the properties of the insulating film.

That is, according to the invention, it is possible to provide a nitride semiconductor device which is capable of being used as a switching device for a long period time.

DESCRIPTION OF EMBODIMENTS

Figure 1:
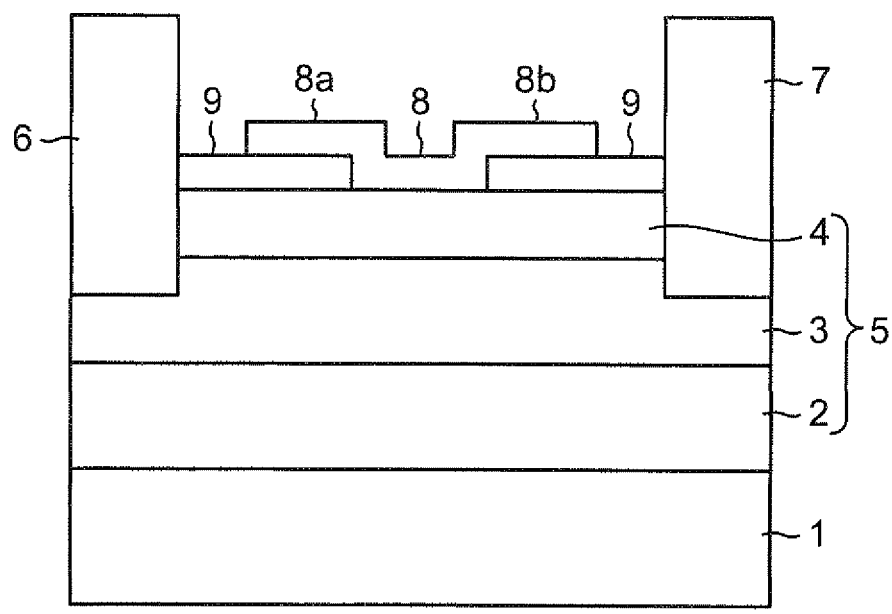
FIG. 1 is a sectional view in a nitride semiconductor HFET as a nitride semiconductor device of the invention.

Hereinafter, the invention will be described in detail with reference to embodiments illustrated in drawings. In the drawings, the same reference numerals denote the same parts or corresponding parts. In addition, the dimensions on the drawing such as the length, the width, the thickness, and the depth have been appropriately changed from the actual scale for clarification and simplification of the drawings, and do not represent actual relative dimensions.

First Embodiment

FIG. 1 is a sectional view in a nitride semiconductor heterojunction field effect transistor (HFET) as a nitride semiconductor device of the first embodiment.

As illustrated in FIG. 1, the nitride semiconductor HFET in the present embodiment is formed by sequentially laminating a buffer layer 2 formed of an undoped AlGaN, a channel layer 3 formed of an undoped GaN, and a barrier layer 4 formed of an undoped $Al_xGa_{1-x}N$ (0<x<1) on a substrate 1 formed of Si. In the present embodiment, an Al mixed crystal ratio x in $Al_xGa_{1-x}N$ satisfies an expression represented by x=0.17.

The above-described two dimensional electron gas is generated on an interface between the channel layer 3 and the barrier layer 4. Note that, in the present embodiment, a nitride semiconductor multilayer structure 5 is formed of the buffer layer 2, the channel layer 3, and the barrier layer 4. In addition, in the present embodiment, the thickness of the barrier layer 4 is set to be 30 nm.

A source electrode 6 and a drain electrode 7 are formed on the nitride semiconductor multilayer structure 5 at an interval set in advance. Here, the source electrode 6 and the drain electrode 7 are formed of, for example, Ti/Al/TiN which is obtained by sequentially laminating Ti, Al, and TiN. Note that, the source electrode 6 and the drain electrode 7 are formed such that a recess to reach the channel layer 3 is formed in a place where the source electrode 6 and the drain electrode 7 are formed in the nitride semiconductor multilayer structure 5, and an ohmic contact is formed by sputtering and annealing an electrode material.

A gate electrode 8 is formed on the nitride semiconductor multilayer structure 5 and between the source electrode 6 and the drain electrode 7. The gate electrode 8 is manufactured by using, for example, WN.

An insulating film 9 formed of silicon nitride (SiN) is formed between the source electrode 6 and the gate electrode 8 and between the gate electrode 8 and the drain electrode 7 on the nitride semiconductor multilayer structure 5. Here, a field plate portion 8a which extends and sticks out over the insulating film 9 is formed at an end portion on the source electrode 6 side in the gate electrode 8. In addition, a field plate portion 8b which extends and sticks out over the insulating film 9 is formed at an end portion on the drain electrode 7 side in the gate electrode 8.

In the present embodiment, as the insulating film 9, a SiN film in which a concentration of Si—H bonds is $2.0 \times 10^{21}$ cm$^{-3}$, a concentration of N—H bonds is $4.0 \times 10^{21}$ cm$^{-3}$, a refractive index is 1.91, and relative permittivity is 7.2 is used. In addition, the thickness of the insulating film 9 is set to be 200 nm.

Although details will be described later, the insulating film 9 has a function of suppressing an increase in the leakage current on a high temperature and high voltage stress test.

Note that, the refractive index of the insulating film 9 is a value obtained by ellipsometrically measuring a single layer membrane which is formed under the same conditions with a wavelength of 633 nm. In addition, the relative permittivity is a value calculated from a capacitance value obtained by measuring a structure in which a single layer membrane which is formed under the same conditions is interposed between metals at a frequency of 100 kHz. The refractive index and the relative permittivity of a second insulating film and a third insulating film in the following embodiments are calculated in the same way.

In addition, the concentration of Si—H bonds and the concentration of N—H bonds of the insulating film 9 are values which are obtained by measuring a single layer membrane which is formed under the same conditions with a fourier transformation infrared spectrophotometer (FT-TR), and are calculated from a peak area and conversion formula disclosed in NPL (W. A. Lanford and M. J. Rand, J. Appl. Phys. 49, 2473 (1978)).

Note that, the concentration of Si—H bonds and the concentration of N—H bonds of the second insulating film and the third insulating film used in the following embodiments are calculated in the same way as that in the case of the insulating film 9.

Next, a method of manufacturing a nitride semiconductor HFET in the present embodiment will be described with FIG. 2 to FIG. 7.

Figure 2:
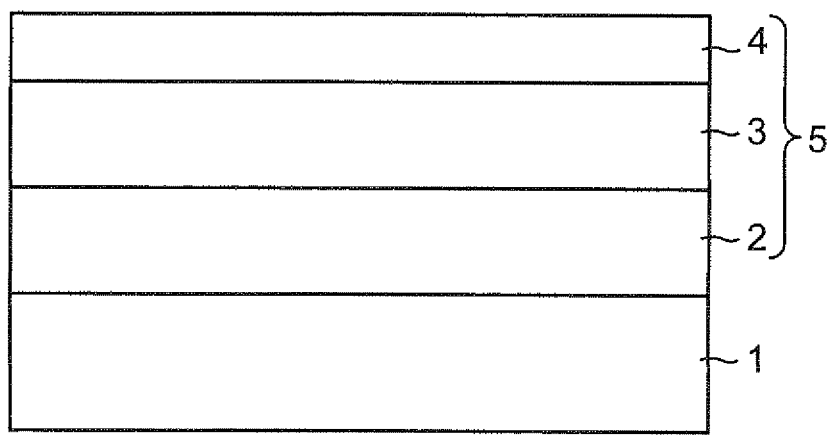
FIG. 2 is a sectional view in a process of manufacturing the nitride semiconductor HFET as illustrated in FIG. 1.

First, as illustrated zn FIG. 2, the undoped AlGaN buffer layer 2, the undoped GaN channel layer 3, and the undoped AlGaN barrier layer 4 are sequentially formed on the Si substrate 1 by using a metal organic chemical vapor deposition (MOCVD) method.

Figure 3:
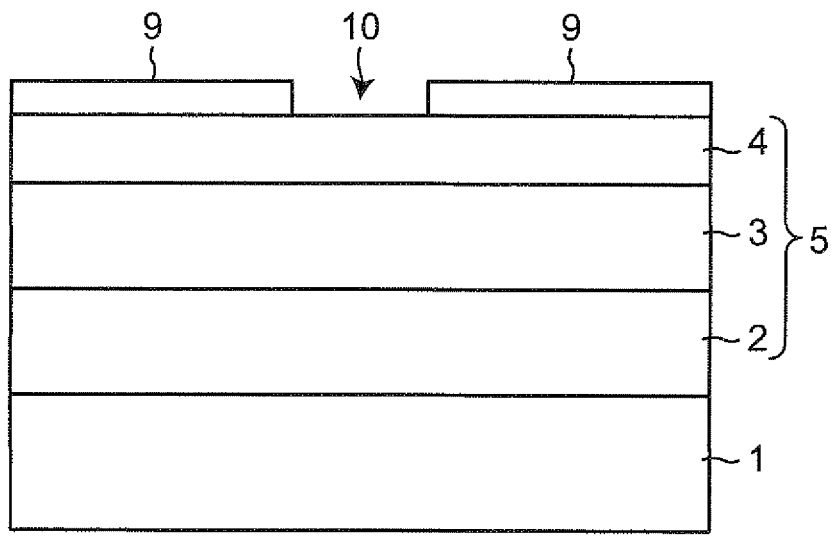
FIG. 3 is a sectional view in a step following FIG. 2.

Next, as illustrated in FIG. 3, a SiN film which is the insulating film 9 is formed on the AlGaN barrier layer 4 by using a plasma chemical vapor deposition (CVD) method. A growth temperature of the insulating film 9 is set, for example, to 225° C.; however, it may be a temperature in a range of 100° C. to 400° C.

Further, a resist pattern is formed on the insulating film 9 through a typically-used photolithography process, and then an opening portion 10 is formed in the insulating film 9 through wet etching using, for example, a buffered hydrofluoric acid (SHE). Note that, the opening portion 10 may be formed through dry etching instead of the wet etching.

Then, in a state illustrated in FIG. 3, for example, annealing (heat treatment) is performed at 800° C. for 60 minutes in a nitrogen atmosphere. With such an annealing treatment, the hydrogen in the SiN film 9 is desorbed, a concentration of Si—H bonds is decreased, and a wet etching rate by the BHF is lowered. With the annealing, the concentration of Si—H bonds of the insulating film 9 is obtained to be $2.0 \times 10^{21}$ cm$^{-3}$.

Figure 15:
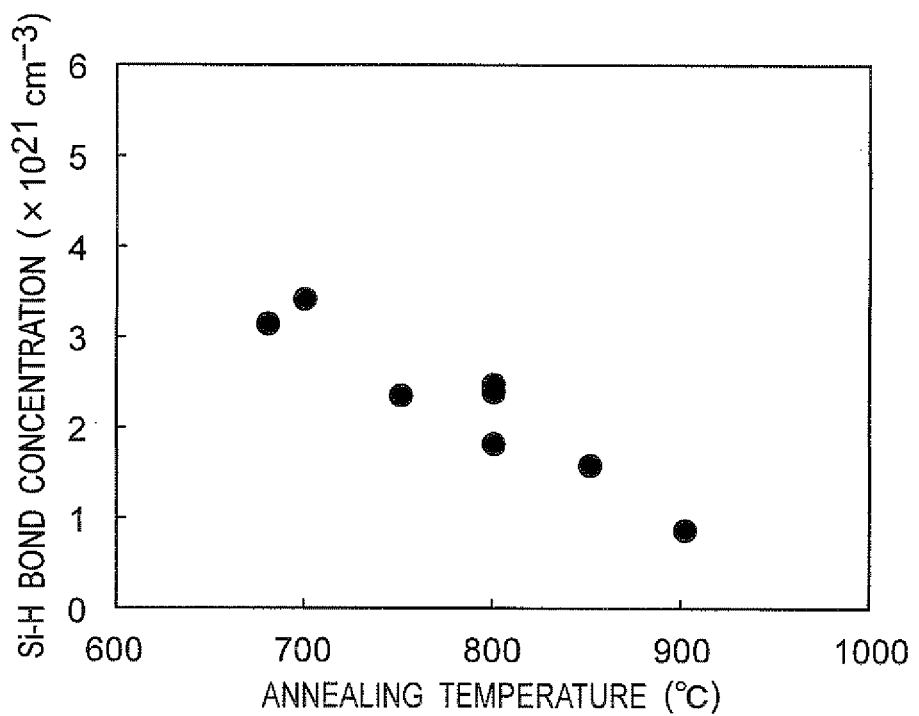
FIG. 15 is a diagram illustrating a relationship between a Si—H bond concentration of an insulating film and an annealing temperature.

Note that, the temperature for annealing the insulating film 9 is set to be, for example, 800° C.; however, in order to obtain the concentration of Si—H bonds of the insulating film 9 to be equal to or less than $6.0 \times 10^{21}$ cm$^{-3}$, the temperature may be 600° C. or higher. That is, if the insulating film 9 is annealed at 600° C., as illustrated in FIG. 15, it is possible to set the concentration of Si—H bonds to be equal to or less than $6.0 \times 10^{21}$ cm$^{-3}$. In this case, if the temperature for annealing the insulating film 9 is set to be 800° C. or higher, it is possible to obtain an effect of suppressing the current collapse.

Figure 4:
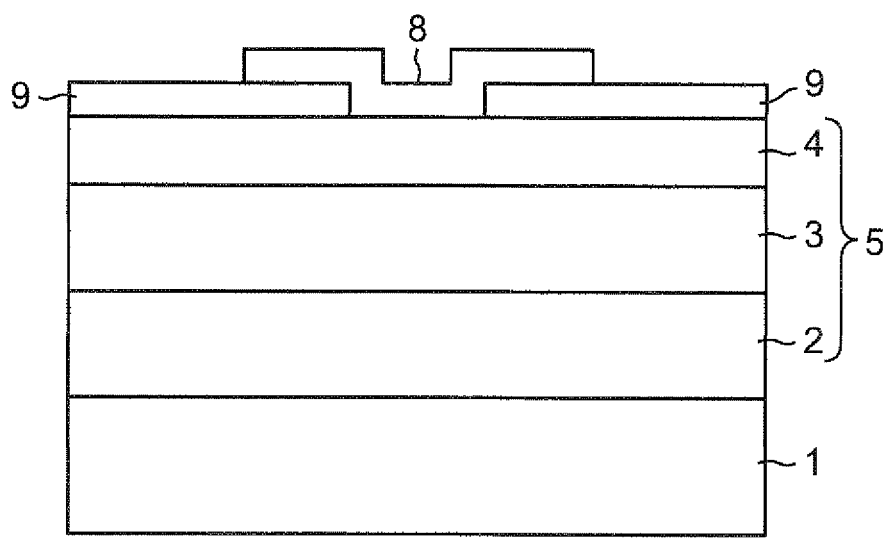
FIG. 4 is a sectional view in a step following FIG. 3.

Next, as illustrated in FIG. 4, WN is sputtered on the insulating film 9 and in the opening portion 10, a resist pattern is formed through a typically-used photolithography process, and then the gate electrode 8 is formed through dry etching.

Figure 5:
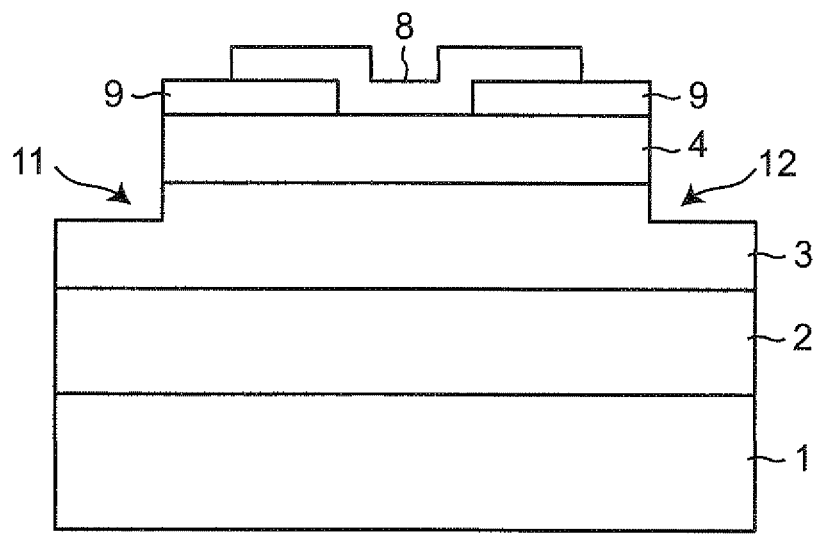
FIG. 5 is a sectional view in a step following FIG. 4.

Then, as illustrated in FIG. 5, a resist pattern is formed on the insulating film 9 and the gate electrode 8 through a typically-used photolithography process, and then a portion of the insulating film 9, a portion of the undoped AlGaN barrier layer 4, and a portion of the undoped GaN channel layer 3 are removed through dry etching so as to form opening portions 11 and 12. Note that, the opening portions 11 and 12 may be formed in the insulating film 9 through wet etching instead of the dry etching.

Figure 6:
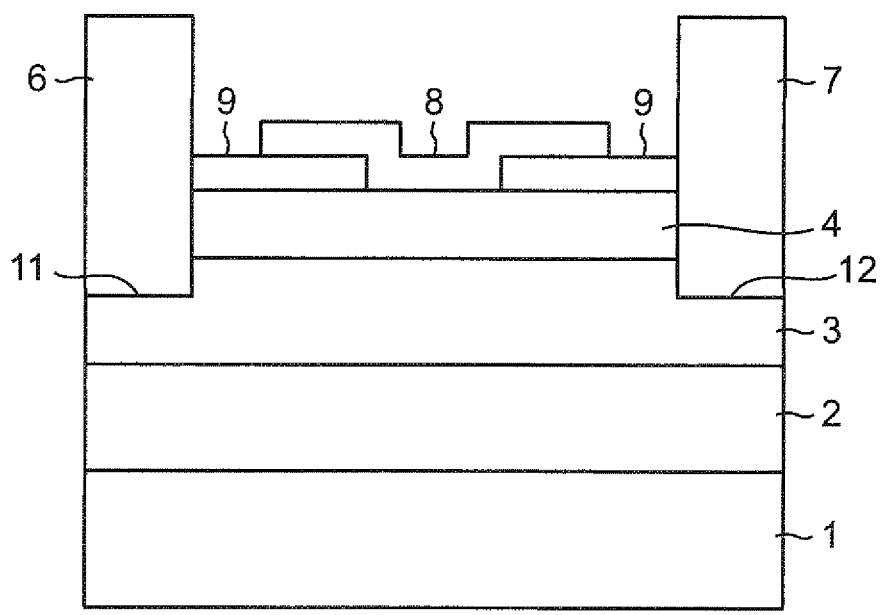
FIG. 6 is a sectional view in a step following FIG. 5.

Next, as illustrated in FIG. 6, a Ti/Al/TiN multilayer metal film is formed by sequentially laminating Ti, Al, and TiN on the insulating film 9 and in the opening portions 11 and 12 through sputtering. Here, a TiN layer is a cap layer for protecting a Ti/Al layer from a post-process. Note that, Ti and Al may be laminated through vapor deposition instead of the sputtering. After this, for example, an ohmic contact between the GaN channel layer 3 and the Ti/Al/TiN multilayer metal film is obtained by performing annealing at a temperature of 400° C. or higher and 500° C. or lower for 10 minutes or longer.

After that, a resist pattern is formed through a typically-used photolithography process, and then the source electrode 6 and the drain electrode 7 are formed by dry etching. In this way, the nitride semiconductor HFET is complete.

The present inventors conducted various studies regarding the insulating film 9 formed on the nitride semiconductor multilayer structure 5. As a result, it was found that when an insulating film formed of SiN having a concentration of Si—H bonds equal to or less than $6.0 \times 10^{21}$ cm$^{-3}$ is used, it is possible to suppress the increase in the leakage current through the high temperature and high voltage stress test.

Here, the high temperature and high voltage stress test is an acceleration test for evaluating an increase of the leakage current by causing the nitride semiconductor HFET to be kept for a certain time at an off voltage higher than a typically-used off voltage in a state where the nitride semiconductor HFET is kept at a temperature higher than a typically-used temperature, and in a switching off state. When using the nitride semiconductor HFET as a switching device, it is essential that the increase in the leakage current is suppressed so as to prevent the HFET from being destroyed due to the leakage current.

Figure 7:
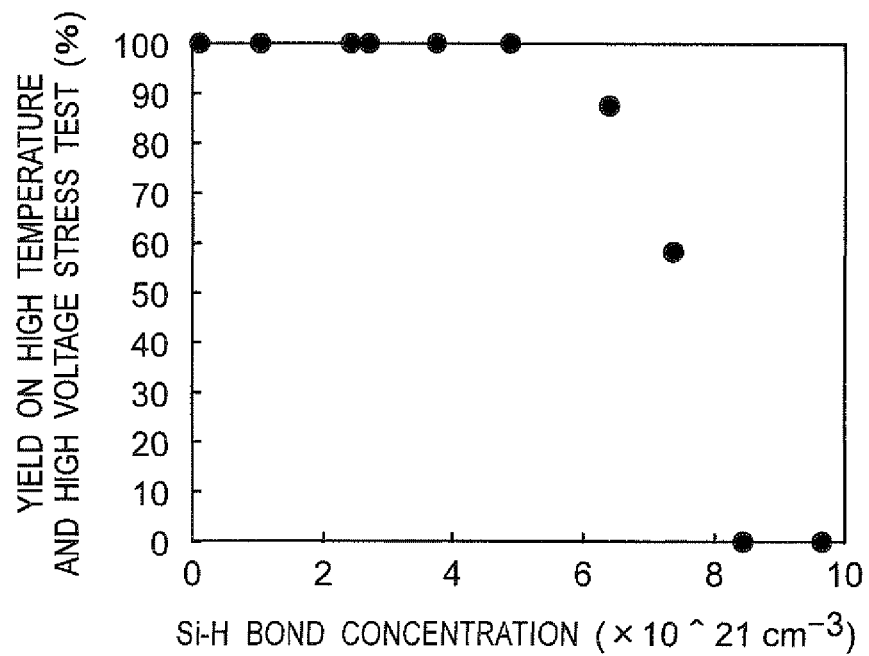
FIG. 7 is a diagram illustrating a relationship between a yield on a high temperature and high voltage stress test and a Si—H bond concentration of an insulating film.

FIG. 7 illustrates a relationship between the yield on the high temperature and high voltage stress test and the Si—H bond concentration of the insulating film 9 which is formed on the nitride semiconductor. In the test, a gate voltage is set such that the nitride semiconductor HFET is in an off state, and a voltage of 650 V is applied to the drain electrode 7 for 100 hours under the ambient temperature of 180° C. The yield is calculated by measuring the leakage current of the HFET before and after conducting the test, and then determining an element in which the leakage current after the test exceeds five times the leakage current before the test to be defective.

With reference to FIG. 7, it is confirmed that when the concentration of Si—H bonds of the SiN used as the insulating film 9 is equal to or less than $6 \times 10^{21}$ cm$^{-3}$, it is possible to achieve a yield of 100% on the high temperature and high voltage stress test, and thus the nitride semiconductor device can be used as a switching device.

In addition, when the concentration of N—H bonds of the SiN used as the insulating film 9 is set equal to or greater than $1.0 \times 10^{21}$ cm$^{-3}$, even in a case where 650 V of voltage is applied to the drain electrode 7 for 200 hours in a state where the nitride semiconductor HFET is off, it is possible to achieve a yield of 100% on the high temperature and high voltage stress test.

In addition, if the insulating film 9 formed of the SiN is annealed at 800° C. or higher, it is possible to obtain the effect of suppressing the current collapse.

Second Embodiment

Figure 8:
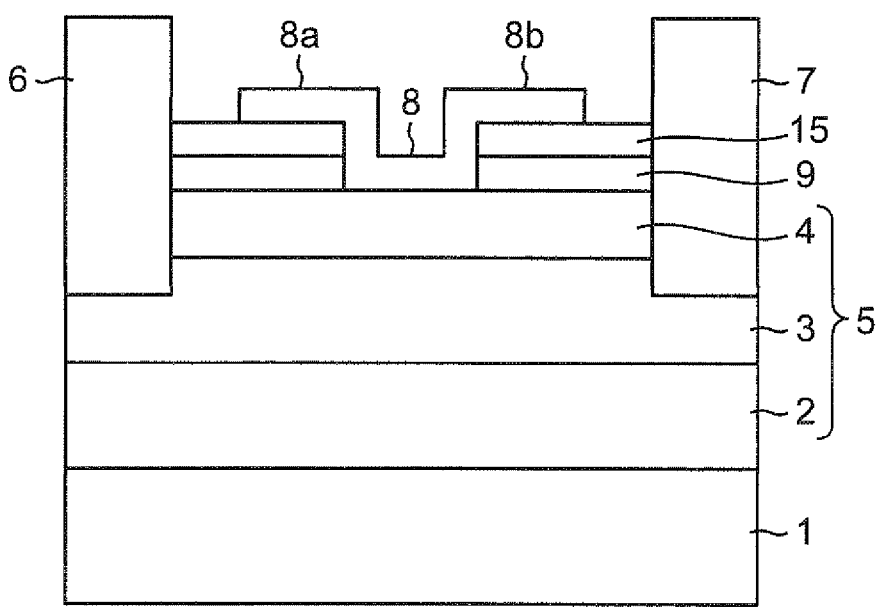
FIG. 8 is a sectional view in a nitride semiconductor HFET which is different from the nitride semiconductor HFET illustrated in FIG. 1.

FIG. 8 is a sectional view in a nitride semiconductor HEFT of the second embodiment.

As illustrated in FIG. 8, the nitride semiconductor HFET in the present embodiment includes the same nitride semiconductor multilayer structure 5 as that in the first embodiment. In addition, an insulating film formed between the source electrode 6 and the gate electrode 8 and between the gate electrode 8 and the drain electrode 7 on the nitride semiconductor multilayer structure 5 is formed of a first insulating film 9 formed of silicon nitride (SiN) which is the same as the insulating film 9 in the first embodiment, and a second insulating film 15 formed of SiN on the first insulating film 9. Except for this configuration, the rest configurations are the same as those in the first embodiment.

In the present embodiment, as a SiN film of the first insulating film 9, a SiN film in which a concentration of Si—H bonds is $2.0\times10^{21}$ cm$^{-3}$, a concentration of N—H bonds is $4.0\times10^{21}$ cm$^{-3}$, a refractive index is 1.91, and relative permittivity is 7.2 is used. In addition, the thickness of the first insulating film 9 is set to be 10 nm.

In addition, as the second insulating film 15, a SiN film in which the concentration of Si—H bonds is $6.0\times10^{21}$ cm$^{-3}$, the concentration of N—H bonds is $1.0\times10^{21}$ cm$^{-3}$, the refractive index is 1.99, and the relative permittivity is 7.8 is used. In addition, the thickness of the second insulating film 15 is set to be 200 nm.

Although details will be described later, the second insulating film 15 has a function of protecting the first insulating film 9 in a process of manufacturing the nitride semiconductor HFET.

Next, a method of manufacturing the nitride semiconductor HFET in the present embodiment will be described with reference to FIG. 2 and FIG. 9.

First, similarly to the case in the first embodiment, as illustrated in FIG. 2, the undoped AlGaN buffer layer 2, the undoped GaN channel layer 3, and the undoped AlGaN barrier layer 4 are sequentially formed on the Si substrate 1. In addition, similar to the case of the insulating film 9 in the first embodiment, the SiN film which is the first insulating film 9 is formed on the AlGaN barrier layer 4 by using a plasma CVD method.

Subsequently, the SiN film which is the second insulating film 15 is formed by using a plasma CVD method. The growth temperature of the first insulating film 9 and the second insulating film 15 is set to be, for example, 225° C.; however, it may be a temperature in a range of 100° C. to 400° C.

Figure 9:
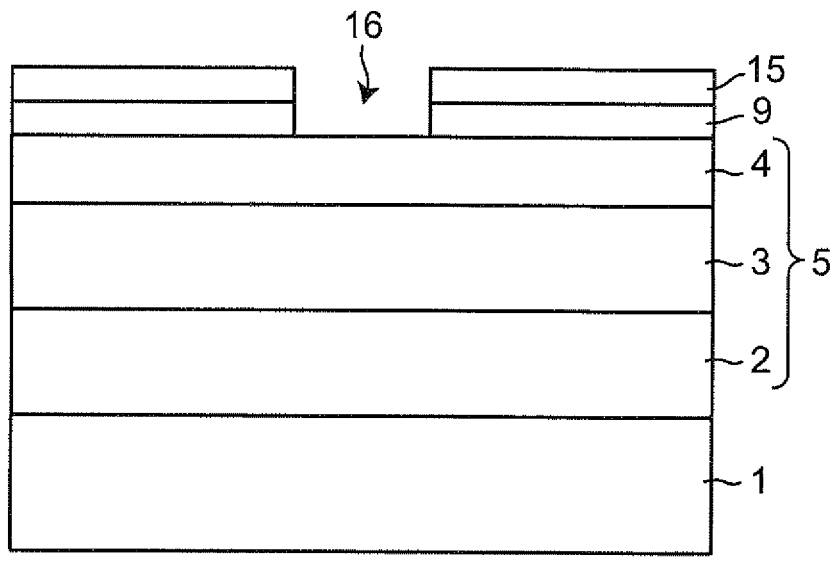
FIG. 9 is a sectional view in the process of manufacturing the nitride semiconductor HFET illustrated in FIG. 8.

Then, a resist pattern is formed on the second insulating film 15 through a typically-used photolithography process, and then an opening portion 16 is formed on the first insulating film 9 and the second insulating film 15 by wet etching using, for example, the above-described BHF as illustrated in FIG. 9. Note that, the opening portion 16 may be formed through dry etching instead of the wet etching.

At this time, when the first insulating film 9 is covered with the second insulating film 15 having the concentration of Si—H bonds greater than that of the first insulating film 9, it is possible to prevent the first insulating film 9 from being reformed due to a chemical solution treatment or a plasma treatment at the time of peeling the resist in the photolithography process.

Next, in the state as illustrated in FIG. 9, annealing (heat treatment) is performed at 800° C. for 60 minutes in a nitrogen atmosphere. With such an annealing treatment, the hydrogen in the SiN film is desorbed, a concentration of Si—H bonds is decreased, and a wet etching rate by the SHE is lowered. With the annealing, the concentration of Si—H bonds of the first insulating film 9 is set to be $2.0\times10^{21}$ cm$^{-3}$, and the concentration of Si—H bonds of the second insulating film 15 is set to be $6.0\times10^{21}$ cm$^{-3}$.

Then, WN is sputtered on the second insulating film 15 and in the opening portion 16. Thereafter, the same process as the process performed on the insulating film 9 in the first embodiment is performed on the second insulating film 15, and thereby, the nitride semiconductor HFET is complete.

The present inventors conducted studies regarding the second insulating film 15 formed on the first insulating film 9. As a result, it was found that with an insulating film which is formed of SiN having the concentration of Si—H bonds greater than that of the first insulating film 9 and is resistant to the chemical solution treatment and the plasma treatment at the time of peeling the resist, it is possible to protect the first insulating film 9, and it is possible to further suppress the increase in the leakage current through the high temperature and high voltage stress test.

Third Embodiment

Figure 10:
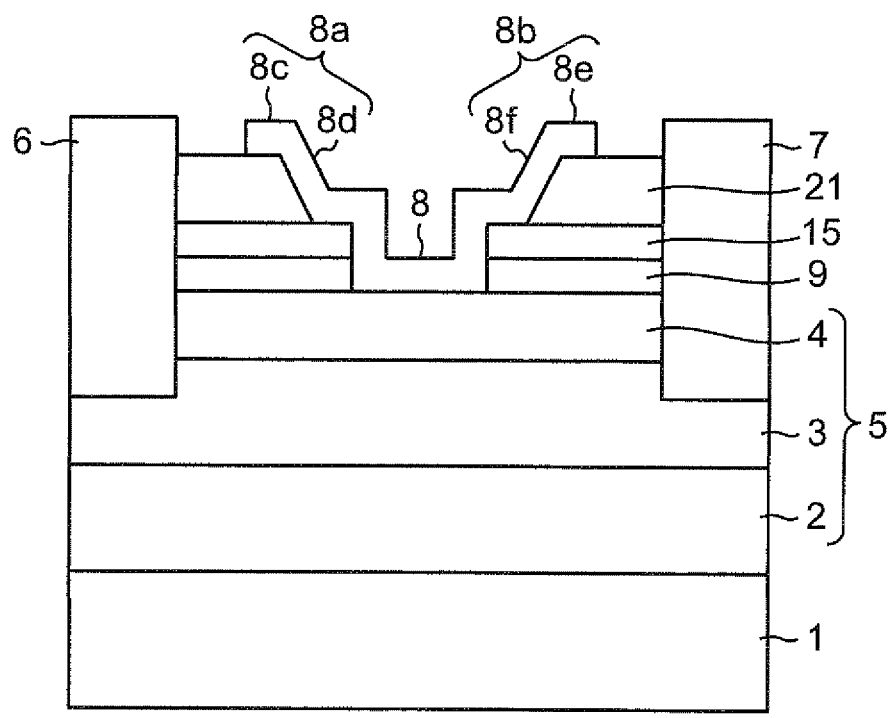
FIG. 10 is a sectional view in a nitride semiconductor HFET which is different from the nitride semiconductors HFET illustrated in FIG. 1 and FIG. 8.

FIG. 10 is a sectional view in the nitride semiconductor HFET of the third embodiment.

As illustrated in FIG. 10, in the nitride semiconductor HFET in the present embodiment, an insulating film formed between the source electrode 6 and the gate electrode 8 and between the gate electrode 8 and the drain electrode 7 on the nitride semiconductor multilayer structure 5 includes a first insulating film 9 formed of silicon nitride (SiN) which is the same as the insulating film 9 in the first embodiment, a second insulating film 15 formed of SiN which is formed similarly to the second insulating film 15 of the second embodiment on the first insulating film 9, and a third insulating film 21 formed of SiN on the second insulating film 15. Except for this configuration, the configurations are the same as those in the first embodiment.

In the present embodiment, as the first insulating film 9, a SiN film in which a concentration of Si—H bonds is $2.0\times10^{21}$ cm$^{-3}$, a concentration of N—H bonds is $4.0\times10^{21}$ cm$^{-3}$, a refractive index is 1.91, and relative permittivity is 7.2 is used. In addition, the thickness of the first insulating film 9 is set to be 10 nm.

In addition, as the second insulating film 15, a SiN film in which a concentration of Si—H bonds is $8.0\times10^{21}$ cm$^{-3}$, a concentration of N—H bonds is $2.0\times10^{21}$ cm$^{-3}$, a refractive index is 1.99, and relative permittivity is 7.8 is used. In addition, the thickness of the second insulating film 15 is set to be 20 nm.

In addition, as the third insulating film 21, a SiN film in which a concentration of Si—H bonds is $2.0\times10^{21}$ cm$^{-3}$, a concentration of N—H bonds is $1.3\times10^{22}$ cm$^{-3}$, a refractive index is 1.87, and relative permittivity is 6.8 is used. In addition, the thickness of the third insulating film 21 is set to be 150 nm.

The third insulating film 21 has the concentration of Si—H bonds less than that of the second insulating film 15, and thus has a function of decreasing the leakage current from the gate electrode 8 with high insulation properties.

Next, a method of manufacturing a nitride semiconductor HFET in the present embodiment will be described with reference to FIG. 9 and FIGS. 11 to 14.

First, similarly to the first embodiment and the second embodiment, as illustrated in FIG. 9, the undoped AlGaN buffer layer 2, the undoped GaN channel layer 3, and the undoped AlGaN barrier layer 4 are sequentially formed on the Si substrate 1. In addition, the SiN film which is the first insulating film 9 is formed on the AlGaN barrier layer 4. Subsequently, similarly to the second embodiment, a SiN film which is the second insulating film 15 is formed. In this state, annealing is performed at 800° C. for 60 minutes in a nitrogen atmosphere. With the annealing, the concentration of Si—H bonds of the first insulating film 9 is set to be $2.0\times10^{21}$ cm$^{-3}$, and the concentration of Si—H bonds of the second insulating film 15 is set to be $6.0\times10^{21}$ cm$^{-3}$. Further, similarly to the above-described second embodiment, the opening portion 16 is formed in the first insulating film 9 and the second insulating film 15. Hereinafter, in the present embodiment, the opening portion 16 is referred to as a first opening portion 16.

Next, the SiN film which is the third insulating film 21 is formed on the second insulating film 15 by using a plasma CVD method. The growth temperature of the third insulating film 21 is set to be, for example, 225° C.; however, it may be a temperature in a range of 100° C. to 400° C.

Figure 11:
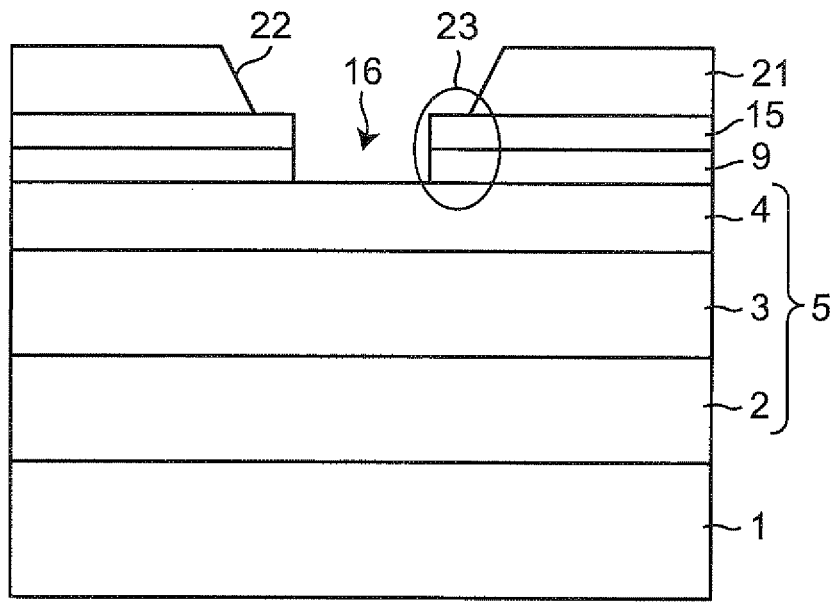
FIG. 11 is a sectional view in the process of manufacturing the nitride semiconductor HFET illustrated in FIG. 10.

Then, as illustrated in FIG. 11, a resist pattern is formed on the third insulating film 21 through a typically-used photolithography process, and then a second opening portion 22 is formed at a location of the opening portion 16 on the third insulating film 21 by the wet etching using, for example, the above-described BHF.

In this case, the wet etching rate of the third insulating film 21 is higher than the wet etching rate of the annealed second insulating film 15, and thus a stepped shape 23 which is formed at an edge of the first opening portion 16 is formed in the second opening portion 22.

Next, in the state illustrated in FIG. 11, annealing (heat treatment) is performed at 680° C. for 60 minutes in a nitrogen atmosphere. With such an annealing treatment, hydrogen in the SiN film is desorbed, a concentration of Si—H bonds is decreased, and a wet etching rate by the BHF is lowered. With the annealing, the concentration of Si—H bonds of the first insulating film 9 is set to be $3\times10^{21}$ cm$^{-3}$, and the concentration of Si—H bonds of the second insulating film 15 is set to be $8\times10^{21}$ cm$^{-3}$, and the concentration of Si—H bonds of the third insulating film 21 is set to be $2\times10^{21}$ cm$^{-3}$.

Figure 12:
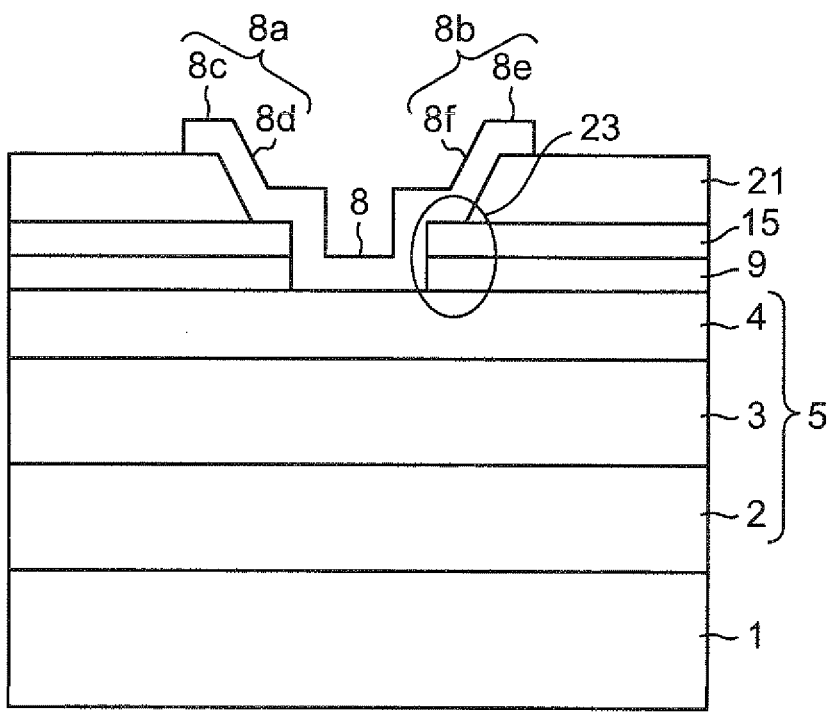
FIG. 12 is a sectional view in a step following FIG. 11.

Next, as illustrated in FIG. 12, WN is sputtered on the third insulating film 21 and in the first and second opening portions 16 and 22, a resist pattern is formed through a typically used photolithography process, and then the gate electrode 8 is formed through dry etching.

At this time, the stepped shape 23 is formed in the second opening portion 22, and thus a field plate portion 8a, including a tip end portion 8c which extends and sticks out over the third insulating film 21 and a middle portion 8d which covers an opening surface of the second opening portion 22 in the third insulating film 21, is formed at an end portion on the source electrode 6 side in the gate electrode 8. In addition, a field plate portion Bb including a tip end portion Be which extends and sticks over the third insulating film 21 and a middle portion 8f which covers an opening surface of the second opening portion 22 in the third insulating film 21, is formed at an end portion on the drain electrode 7 side in the gate electrode 8.

The field plates 8a and 8b have a function of, when the nitride semiconductor HFET is used as a switching device, relaxing the electric field intensity applied to the nitride semiconductor multilayer structure 5 and the insulating films 9, 15, and 21 in the vicinity of the gate electrode 8 at the time of turning off.

Figure 13:
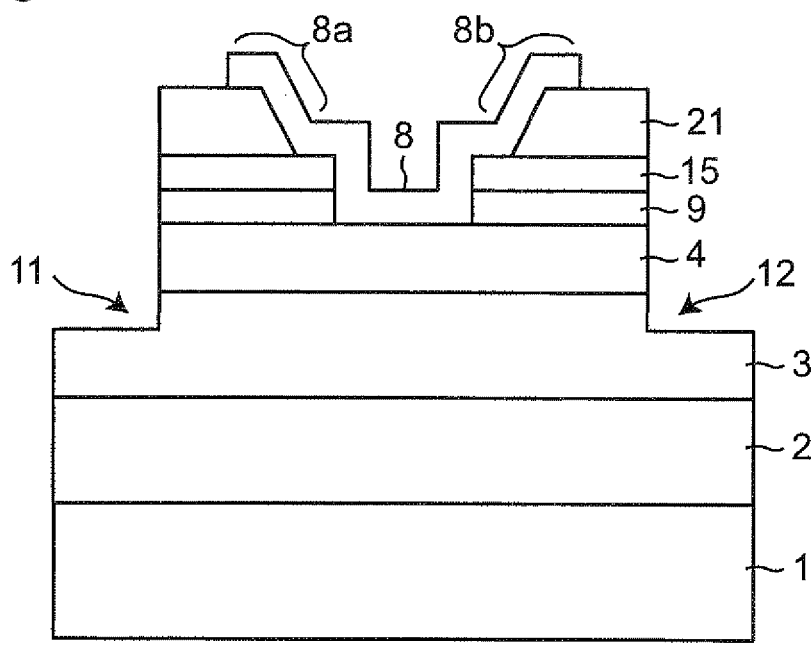
FIG. 13 is a sectional view in a step following FIG. 12.

Next, as illustrated in FIG. 13, a resist pattern is formed on the third insulating film 21 and the gate electrode 8 through a typically-used photolithography process, and then an opening portion is formed in the third insulating film 21 by the wet etching using, for example, the above-described BHF. Subsequently, opening portions 11 and 12 are formed by removing a portion of the second insulating film 15, a portion of the first insulating film 9, a portion of the undoped AlGaN barrier layer 4, and a portion of the undoped GaN channel layer 3 by using the same resist pattern through dry etching. Note that, the opening portion may be formed in the third insulating film 21 through dry etching instead of the wet etching.

Figure 14:
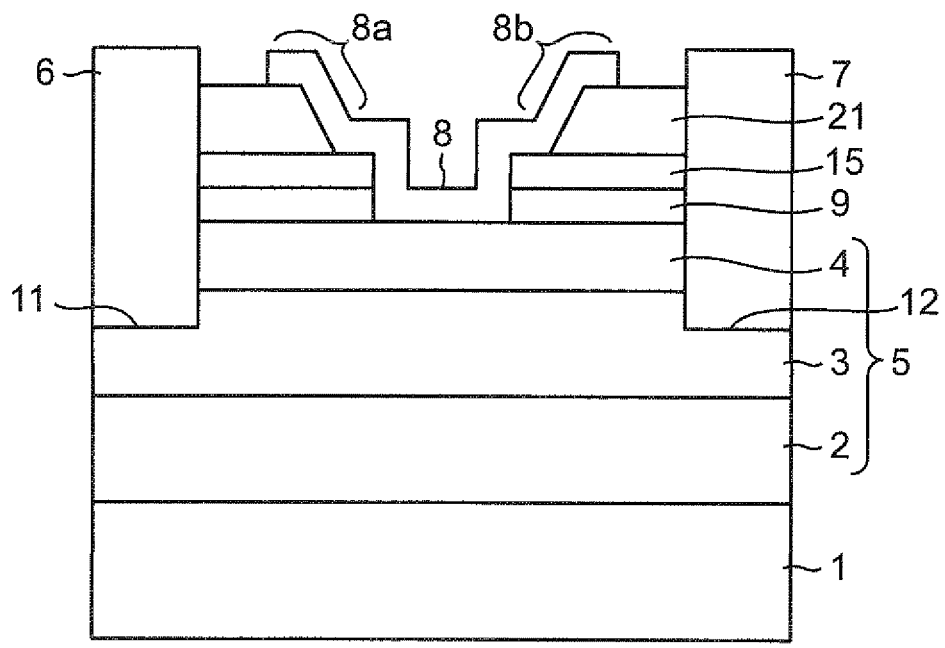
FIG. 14 is a sectional view in a step following FIG. 13.

Next, as illustrated in FIG. 14, a Ti/Al/TiN multilayer metal film is formed by sequentially laminating Ti, Al, and TiN on the third insulating film 21 and in the opening portions 11 and 12 through sputtering. Hereinafter, the same process as that performed on the Ti/Al/TiN multilayer metal film in the first embodiment is performed on the aforementioned Ti/Al/TiN multilayer metal film so as to form the source electrode 6 and the drain electrode 7. In this way, the nitride semiconductor HFET is complete.

The present inventors conducted studies regarding the third insulating film 21 formed on the second insulating film 15. As a result, it was found that as the third insulating film 21, when an insulating film formed of SiN having a concentration of Si—H bonds which is less than that of the second insulating film 15 is used, it is possible to decrease the leakage from the gate electrode 8 with high insulation properties. In addition, it was found that when the field plate portions 8a and 8b are formed on the gate electrode 8, it is possible to relax the electric field intensity applied to the nitride semiconductor multilayer structure 5 and the insulating films 9, 15, and 21 in the vicinity of the gate electrode 8 at the time of turning off, and thus it is possible to further suppress the increase in the leakage current through a high temperature and high voltage stress test.

Note that, the invention is not limited to the above-described embodiments, materials and dimensions and the like in the substrate, the nitride semiconductor multilayer structure 5, the insulating films, and the electrodes may be variously changed within the scope of the claims.

For example, in the respective embodiments, the nitride semiconductor HFET using a Si substrate was described. However, the invention is not limited to the Si substrate. For example, a sapphire substrate or a SiC substrate may be used, or a nitride semiconductor layer may be grown on a substrate which is formed of a nitride semiconductor in which an AlGaN layer is grown on the GaN substrate. In addition, as a component of the nitride semiconductor multilayer structure, a hetero improvement layer may be formed between the channel layer 3 and the barrier layer 4.

In addition, the GaN channel layer 3 is used as a component of the nitride semiconductor multilayer structure 5 in the respective embodiments; however, the AlGaN layer having a composition with a band gap smaller than that of the AlGaN barrier layer 4 may be used instead of the GaN channel layer 3. Further, as a cap layer, a layer which is formed of GaN and has a thickness of approximately 1 nm may be provided on the AlGaN barrier layer 4, for example.

The barrier layer 4 having a thickness in a range of 20 nm to 40 nm is typically used; however, the thickness is not particularly limited. For example, any thickness may be set in order to obtain a desired sheet carrier concentration, a desired threshold voltage, or the like. Further, in the respective embodiments, Al—Ga$_{1-x}$N having the mixed crystal ratio satisfying an expression represented by x=0.17% is used as the barrier layer 4. However, there is no particular limitation as long as it is crystalline which induces the 2 DEG and operates as a transistor.

In addition, in the respective embodiments, the insulating film 9 is annealed at 800° C.; however, the annealing temperature may be equal to or higher than 600° C. When the insulating film 9 is annealed at a temperature equal to or higher than 600° C., it is possible to obtain a concentration of Si—H bonds equal to or less than $6.0\times10^{21}$ cm$^{-3}$.

In addition, the insulating film 9 is annealed after forming the opening portion 16 in the first and second embodiments; whereas the insulating film 9 is annealed before forming the opening portion 16 in the third embodiment. However, any method of the first to third embodiments may be used, and after forming the insulating film 9, the insulating film 9 may be annealed until the gate electrode or the ohmic electrode is formed.

In addition, in the respective embodiments, WN is used as a material of the gate electrode 8; however, the material is not limited to the WN, and for example, a material formed of TiN, Ni/Au, or the like may be used.

Further, in the respective embodiments, as the source electrode 6 and the drain electrode 7, the ohmic electrode is formed by laminating the Ti/Al/TiN; however, the configuration is not limited thereto, and the TiN which is the cap layer is not necessarily formed, for example. In addition, the Ti/Al is laminated through sputtering, and then Au, Ag, Pt, or the like may be laminated thereon. In addition, Ti and Al may be laminated through vapor deposition instead of the sputtering.

Further, in the second and third embodiments, the thickness of the first insulating film 9 is preferably in a range of several nm to 20 nm. If the film thickness is excessively small, the yield on the high temperature and high voltage stress test is decreased. In contrast, if the film thickness is excessively large, when the opening portion 16 for the gate electrode 8 is formed through wet etching, the side etching occurs on the first insulating film 9, and thus voids are formed.

Further, the total thickness of the first insulating film 9 and the second insulating film 15 is preferably in a range of 25 nm to 200 nm. If the film thickness is excessively small, the first insulating film 9 may be reformed due to a chemical solution treatment or a plasma treatment at the time of peeling the resist. In contrast, if the film thickness is excessively large, the effect of the field plates 8a and 8b is reduced.

In addition, in the third embodiment, the thickness of the third insulating film 21 is preferably in a range of 100 nm to several μm. If the film thickness is excessively small, the electric field of the surface of the nitride semiconductor multilayer structure 5 is increased. In contrast, if the film thickness is excessively large, there is a problem in that a stress due to the third insulating film 21 is increased and a wafer is warped.

Hereinafter, to summarize this invention, the nitride semiconductor device of the invention includes a substrate 1; a nitride semiconductor multilayer structure 5 which is formed on the substrate 1, includes a first nitride semiconductor layer 3, and a second nitride semiconductor layer 4 having a different composition from that of the first nitride semiconductor layer 3, and generates two dimensional electron gas on a hetero interface between the first nitride semiconductor layer 3 and the second nitride semiconductor layer 4; and an insulating film 9 which covers at least a portion of a surface of the nitride semiconductor multilayer structure 5, has a concentration of Si—H bonds equal to or less than $6.0 \times 10^{21}$ cm$^{-3}$, and is formed of silicon nitride.

With reference to FIG. 7, in a case where a concentration of Si—H bonds in the silicon nitride used as the insulating film 9 is equal to or less than $6 \times 10^{21}$ cm$^{-3}$ it is realized that a yield of 100% is achieved on the high temperature and high voltage stress test.

With such a configuration, the insulating film 9 which covers at least a portion of a surface of the nitride semiconductor multilayer structure 5 and is formed of silicon nitride has a concentration of Si—H bonds equal to or less than $6.0 \times 10^{21}$ cm$^{-3}$. Accordingly, in a case of conducting a high temperature and high voltage stress test on a semiconductor element by using the nitride semiconductor device, it is possible to prevent occurrence of defects in which the leakage current after the test exceeds five times the leakage current before the test, and thereby it is possible to improve the properties of the insulating film 9.

That is, it is possible to provide a nitride semiconductor device which is capable of being used as a switching device for a long period time.

In addition, in the nitride semiconductor device of an embodiment, the silicon nitride which forms the insulating film 9 has the refractive index of equal to or lower than 1.95.

In addition, in the nitride semiconductor device of an embodiment, a concentration of N—H bonds of the silicon nitride which forms the insulating film 9 is equal to or greater than $1.0 \times 10^{21}$ cm$^{-3}$.

According to such an embodiment, a concentration of N—H bonds in the insulating film 9 is equal to or greater than $1.0 \times 10^{21}$ cm$^{-3}$. Accordingly, in a case of conducting a high temperature and high voltage stress test on a semiconductor element by using the nitride semiconductor device under the strict conditions, it is possible to prevent occurrence of defects in which the leakage current after the test exceeds five times the leakage current before the test, and thereby it is possible to improve the properties of the insulating film 9.

In addition, in the nitride semiconductor device of an embodiment, the silicon nitride which forms the insulating film 9 has the relative permittivity which is higher than 6 and lower than 8 at 100 kHz.

In addition, in the nitride semiconductor device of an embodiment, the insulating film 9 is a first insulating film and the nitride semiconductor device further includes a second insulating film 15 which is laminated on the first insulating film 9, and is formed of silicon nitride of which a concentration of the Si—H bonds is greater than that of the first insulating film 9.

According to such an embodiment, the second insulating film 15 laminated on the first insulating film 9 in which the leakage current after conducting the high temperature and high voltage stress test does not exceeds five times the leakage current before the test uses the insulating film formed of the silicon nitride having a concentration of the Si—H bonds greater than that of the first insulating film 9. Accordingly, the second insulating film 15 is resistant to the chemical solution treatment and the plasma treatment at the time of peeling the resist and is excellent in stabilizing the surface, and thus it is possible to protect the first insulating film 9, thereby further suppressing the increase in the leakage current on the high temperature and high voltage stress test.

Further, in the nitride semiconductor device of an embodiment, the silicon nitride forming the second insulating film 15 has the refractive index which is higher than 1.95 and lower than 2.00.

In addition, in the nitride semiconductor device of an embodiment, a total film thickness of the first insulating film 9 and the second insulating film 15 is equal to or greater than 25 nm.

According to such an embodiment, the total thickness of the first insulating film 9 and the second insulating film 15 is equal to or greater than 25 nm, and thus it is possible to prevent the first insulating film 9 from being reformed due to the chemical solution treatment or the plasma treatment at the time of peeling the resist.

In addition, the nitride semiconductor device of an embodiment further includes a third insulating film 21 which covers at least a portion of the second insulating film 15, is formed of silicon nitride of which a concentration of Si—H bonds is less than that of the second insulating film 15.

According to such an embodiment, the silicon nitride of which a concentration of the Si—H bonds is less than that of the second insulating film 15 is used as the third insulating film 21 which covers the second insulating film 15. Accordingly, it is possible to decrease the leakage current with high insulation properties of the insulating film.

In addition, in the nitride semiconductor device of an embodiment, the silicon nitride which forms the third insulating film 21 has a refractive index of equal to or lower than 1.90.

Further, a method of manufacturing a nitride semiconductor device of the invention is a method of manufacturing the nitride semiconductor device of the invention or an embodiment, in which the insulating film 9 is annealed at 800° C. or higher.

With such a configuration, it is possible to suppress the current collapse by annealing the insulating film 9 at 800° C. or higher.

In addition, a method of manufacturing the nitride semiconductor device of the invention includes a step of laminating a nitride semiconductor multilayer structure 5 including a first nitride semiconductor layer 3 and a second nitride semiconductor layer 4 having a different composition from that of the first nitride semiconductor layer 3 on a substrate 1 such that two dimensional electron gas is generated in a hetero interface between the first nitride semiconductor layer 3 and the second nitride semiconductor layer 4; and a step of covering at least a portion of the surface of the nitride semiconductor multilayer structure 5 with an insulating film 9 which has a concentration of Si—H bonds equal to or less than $6.0 \times 10^{21}$ cm$^{-3}$, and formed of the silicon nitride.

With such a configuration, a concentration of the Si—H bonds of the insulating film 9 which covers at least a portion of the surface of the nitride semiconductor multilayer structure 5 and is formed of the silicon nitride is set to be equal to or less than $6.0 \times 10^{21}$ cm$^{-3}$. Accordingly, in a case of conducting a high temperature and high voltage stress test on the present nitride semiconductor device, it is possible to prevent occurrence of defects in which the leakage current after the test exceeds five times the leakage current before the test, and thereby it is possible to improve the properties of the insulating film 9.

That is, it is possible to provide a nitride semiconductor device which is capable of being used as a switching device for a long period time.

In addition, a method of manufacturing the nitride semiconductor device of the invention includes a step of laminating a nitride semiconductor multilayer structure 5 including a first nitride semiconductor layer 3 and a second nitride semiconductor layer 4 having a different composition from that of the first nitride semiconductor layer 3 on a substrate 1 such that two dimensional electron gas is generated in a hetero interface between the first nitride semiconductor layer 3 and the second nitride semiconductor layer 4; and a step of covering at least a portion of the surface of the nitride semiconductor multilayer structure 5 with an insulating film 9 which has a refractive index equal to or lower than 1.95 and is formed of the silicon nitride.

With such a configuration, the refractive index of the insulating film 9 which covers at least a portion of the surface of the nitride semiconductor multilayer structure 5 and is formed of the silicon nitride is set to be equal to or lower than 1.95.

In addition, the method of manufacturing a nitride semiconductor device of an embodiment further includes a step of the insulating film 9 being a first insulating film and laminating a second insulating film 15 which is laminated on the first insulating film 9 and is formed of the silicon nitride of which a concentration of the Si—H bonds is greater than that of the first insulating film 9.

According to such an embodiment, the second insulating film 15 formed of the silicon nitride having a concentration of Si—H bonds greater than that of the first insulating film 9 is laminated on the first insulating film 9 in which the leakage current after conducting the high temperature and high voltage stress test does not exceeds five times the leakage current before the test.

Accordingly, it is possible to protect the first insulating film 9, and thereby further suppressing the increase in the leakage current through the high temperature and high voltage stress test.

In addition, in the method of manufacturing a nitride semiconductor device of an embodiment, the above-described silicon nitride forming the second insulating film 15 laminated in the step of laminating the second insulating film 15 has the refractive index of higher than 1.95 and lower than 2.00.

In addition, the method of manufacturing a nitride semiconductor device of an embodiment further includes a step of covering at least a portion of the second insulating film 15 with a third insulating film 21 which is formed of the silicon nitride of which a concentration of the Si—H bonds is less than that of the second insulating film 15.

According to such an embodiment, the second insulating film 15 is covered with the third insulating film 21 formed of the silicon nitride of which a concentration of the Si—H bonds is less than that of the second insulating film 15. Accordingly, it is possible to decrease the leakage current with high insulation properties of the insulating film.

In addition, in the method of manufacturing a nitride semiconductor device of an embodiment, the silicon nitride which forms the third insulating film 21 laminated in the step of laminating the third insulating film 21 has the refractive index of equal to or lower than 1.90.

REFERENCE SIGNS LIST

1 SUBSTRATE
2 UNDOPED AlG$_a$N BUFFER LAYER
3 UNDOPED GaN CHANNEL LAYER
4 UNDOPED AlGaN BARRIER LAYER
5 NITRIDE SEMICONDUCTOR MULTILAYER STRUCTURE
6 SOURCE ELECTRODE
7 DRAIN ELECTRODE
8 GATE ELECTRODE
8a, 8b FIELD PLATE PORTION
9 INSULATING FILM, FIRST INSULATING FILM
10, 11, 12, 16, 22 OPENING PORTION
15 SECOND INSULATING FILM
21 THIRD INSULATING FILM
23 STEPPED SHAPE

The invention claimed is:

1. A nitride semiconductor device comprising:
a substrate;
a nitride semiconductor multilayer structure which is formed on the substrate, includes a first nitride semiconductor layer and a second nitride semiconductor layer having a different composition from a composition of the first nitride semiconductor layer, and generates two-dimensional electron gas on a hetero interface between the first nitride semiconductor layer and the second nitride semiconductor layer; and
an insulating film which covers at least a portion of a surface of the nitride semiconductor multilayer structure, has a concentration of Si—H bonds equal to or less than $6.0 \times 10^{21}$ cm$^{-3}$, and is found of silicon nitride, wherein the silicon nitride forming the insulating film has a concentration of N—H bonds equal to or greater than $1.0 \times 10^{21}$ cm$^{-3}$.

2. The nitride semiconductor device according to claim 1, wherein
the insulating film is a first insulating film and
the nitride semiconductor device further comprises a second insulating film which is laminated on the first insulating film and is formed of silicon nitride of which a concentration of Si—H bonds is greater than the concentration of Si—H bonds of the first insulating film.

3. The nitride semiconductor device according to claim 2, wherein a total film thickness of the first insulating film and the second insulating film is equal to or greater than 25 nm.

4. The nitride semiconductor device according to claim 2, further comprising:
a third insulating film which covers at least a portion of the second insulating film, is formed of silicon nitride of which a concentration of Si—H bonds is less than the concentration of Si—H bonds of the second insulating film.

5. A method of manufacturing a nitride semiconductor device, the method manufacturing the nitride semiconductor device according to claim 1,
wherein the insulating film is annealed at 800° C. or higher.

* * * * *